(12) United States Patent
Van Den Enden et al.

(10) Patent No.: US 7,376,690 B2
(45) Date of Patent: May 20, 2008

(54) TIME DISCRETE FILTER COMPRISING UPSAMPLING, SAMPLING RATE CONVERSION AND DOWNSAMPLING STAGES

(75) Inventors: Adrianus Wilhelmus Maria Van Den Enden, Eindhoven (NL); Marc Victor Arends, Eindhoven (NL)

(73) Assignee: NXP B.V., Eindhoven (NL)

( * ) Notice: Subject to any disclaimer, the term of this patent is extended or adjusted under 35 U.S.C. 154(b) by 704 days.

(21) Appl. No.: 10/495,583

(22) PCT Filed: Oct. 24, 2002

(86) PCT No.: PCT/IB02/04478

§ 371 (c)(1),
(2), (4) Date: May 14, 2004

(87) PCT Pub. No.: WO03/044950

PCT Pub. Date: May 30, 2003

(65) Prior Publication Data

US 2004/0260737 A1    Dec. 23, 2004

(30) Foreign Application Priority Data

Nov. 19, 2001    (EP)    ................... 01204416

(51) Int. Cl.
*G06F 17/17*    (2006.01)
(52) U.S. Cl. ...................................................... 708/313
(58) Field of Classification Search ................. 708/313
See application file for complete search history.

(56) References Cited

U.S. PATENT DOCUMENTS 5,717,617 A * 2/1998 Chester ...................... 708/313

(Continued)

FOREIGN PATENT DOCUMENTS

DE    199 40 926 A1    3/2001

(Continued)

OTHER PUBLICATIONS

"On the Transposition of Linear Time-Varying Discrete-Time Networks and its Application to Multirate Digital Systems", by T.A. C.M. Claasen et al., Philips Journal of Research.

(Continued)

*Primary Examiner*—Tan V. Mai
(74) *Attorney, Agent, or Firm*—Peter Zawilski

(57) ABSTRACT

A time discrete filter comprises a sampling rate converter provided with an input and an output, and a down-sampler having a down-sampling factor nd. The time discrete filter further comprises an up-sampler having an up-sampling factor nu, whereby the up-sampler is coupled to the converter input, and the converter output is coupled to the down-sampler. It has been found that if a sampling rate conversion operation is preceded by an up-sampling operation and only after the conversion is followed by a down-sampling operation to a wanted sampling frequency, that then the complexity in terms of the ultimate number of calculations, in particular multiplications and additions, is reduced. This leads to a decrease of the number of instructions per second which is a measure for the complexity of a Digital Signal Processing (DSP) algorithm. In addition this leads to an associated decrease of power consumed by a DSP, such as applied in for example audio, video, and (tele)communication devices, as well as radio and television apparatus.

20 Claims, 4 Drawing Sheets

U.S. PATENT DOCUMENTS

| | | | |
|---|---|---|---|
| 5,903,482 A * | 5/1999 | Iwamura et al. | 708/313 |
| 2002/0116427 A1* | 8/2002 | Jiang et al. | 708/313 |
| 2003/0118092 A1* | 6/2003 | Zangi | 375/229 |

FOREIGN PATENT DOCUMENTS

| WO | WO 99/38257 A2 | 7/1999 |
|---|---|---|
| WO | WO 00/65713 A2 | 11/2000 |

OTHER PUBLICATIONS

"A Generalized Rate Change Filter Architecture", by David Chester, Proceedings of the International Conference on Acoustics, Speech and Signal Processing, vol. 4, Apr. 1993.

* cited by examiner

TIME DISCRETE FILTER COMPRISING UPSAMPLING, SAMPLING RATE CONVERSION AND DOWNSAMPLING STAGES

The present invention relates to a time discrete filter, comprising a sampling rate converter provided with an input and an output, and a down-sampler having a down-sampling factor $n_d$.

The present invention also relates to a communication device comprising such a time discrete filter and to a method, wherein a sampling rate of an input signal is converted with a factor m.

Such a time discrete filter is known from WO 99/38257. The known time discrete filter comprises a cascade arrangement of sampling rate converters, exemplified by respective down-samplers alternated by filter sections in order to require less computational resources in the time discrete filter. Disadvantage is however the comprehensive and complex hardware and software required for the known time discrete filter.

Therefore it is an object of the present invention to provide an improved time discrete filter, whose complexity in terms of required amount of multiplications, additions, as well as storage requirements is reduced.

Thereto the time discrete filter according to the invention is characterised in that it further comprises an up-sampler having an up-sampling factor $n_u$, that the up-sampler is coupled to the converter input, and that the converter output is coupled to the down-sampler.

Consequently the method according to the invention is characterised in that the input signal is first up-sampled with a factor $n_u$, then subjected to the sampling rate conversion with the factor m and finally down-sampled with a factor $n_d$.

Surprisingly it has been found that if a sampling rate conversion operation is preceded by an up-sampling operation and only after the conversion is followed by a down-sampling operation to a wanted sampling frequency, that then the complexity in terms of the ultimate number of calculations, in particular multiplications and additions, necessary in the filter according to the invention is reduced. This leads to a decrease of the number of instructions per second which is a measure for the complexity of a Digital Signal Processing (DSP) algorithm. In addition this leads to an associated decrease of power consumed by DSP in said filter, such as applied in for example audio, video, and (tele)communication devices, as well as radio and television apparatus.

An embodiment of the time discrete filter according to the invention is characterised in that the sampling rate converter is capable of performing decimation or interpolation.

The above advantages hold irrespective whether decimation or interpolation is applied in the filter according to the invention.

A further embodiment of the time discrete filter according to the invention is characterised in that the sampling rate converter has a sampling rate conversion factor m, where m is an integer larger than 2.

Advantageously any sampling rate factor, such as 3, 5, 7 or for example 125, such as necessary in GSM and Bluetooth systems can be used. Preferably prime numbers or a combination of prime numbers are used as sampling rate conversion factors, which normally give rise to a more complicated filter configuration.

A still further embodiment of the time discrete filter according to the invention is characterised in that the up-sampling factor $n_u$ and the down-sampling factor $n_d$ each are larger or equal to 2.

If the up-sampling factor $n_u$ and/or the down-sampling factor $n_d$ are 2, the total complexity is reduced considerably due to the fact that the resulting filter structures are more efficient. If properly implemented such as with FIR and/or IIR filter configurations, also the number of delay elements and the amount of storage required for the data samples and the coefficients in the filter according to the invention decreases, resulting in additional cost savings.

At present the time discrete filter and method according to the invention will be elucidated further together with their additional advantages, while reference is being made to the appended drawing, wherein similar components are being referred to by means of the same reference numerals. In the drawing.

Figure 1:
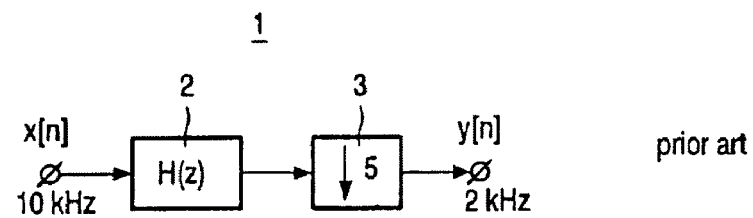
FIG. 1 shows a one stage time discrete down-sampling filter according to the prior art.
Figure 2:
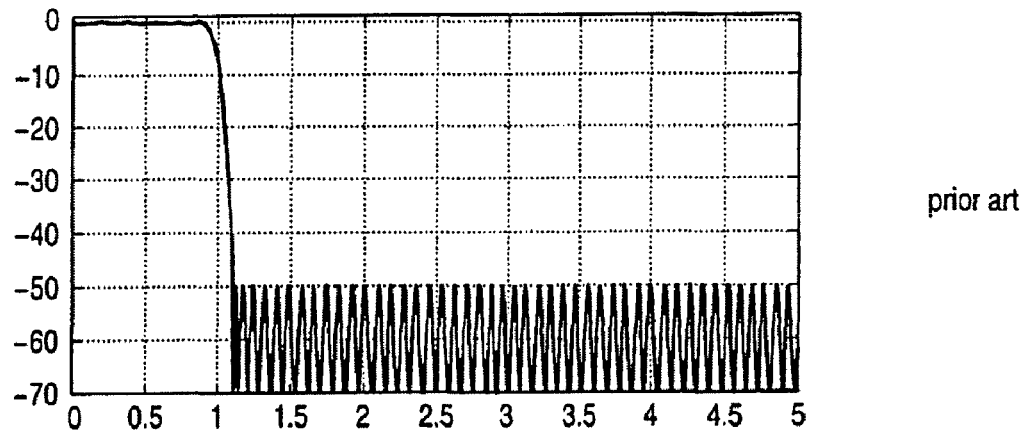
FIG. 2 shows the amplitude characteristic of the one stage FIR filter implementing FIG. 1.

By way of example FIG. 1 shows a one stage time discrete filter 1, comprising a digital filter section 2 having a transfer function H(z) with z being the Z-transform variable, and a sampling rate converter here implemented by for example a down-sampler 3 having a down sampling factor $n_d$. Given $n_d=5$ in this case, a sampled input signal x(n) having a sampling frequency of say 10 KHz reveals an output signal y(n) with a sampling frequency of 2 KHz. The filter 1 should have a low-pass transfer function H(z) such that aliasing terms in the spectrum of the output signal y(n) are attenuated in a practical realisation thereof. In such a realisation the output spectrum between 0 and ±0.9 KHz should have a ripple of ±0.1 dB and the outer stop band between 1.1 KHz and 5 KHz should be attenuated by at least 50 dB. This filter can be devised as a linear phase transversal Finite Impulse Response (FIR) filter of length 115. The digital filter section 2 then has a low-pass amplitude characteristic as shown in FIG. 2. An example of an economic FIR filter implementation is given in FIG. 3, whereby use is made of the well known Polyphase Decomposition, such as for example known from "Multirate Digital Signal Processing" by R. E. Crochiere and L. R. Rabiner, Prentice-Hall, Englewood Cliffs, N.J., 1983, ISBN 0-13-605162-6, whose disclose is included here by reference thereto. The implementation of FIG. 3 has four lines $1_1$, $1_2$, $1_4$, $1_5$ each having 23 multiplications, and a middle line $1_3$, wherein 12 multiplications are needed. The first adder, here and hereafter designated "+", costs 4 additions and the other 22 adders cost 5 additions. The sampling frequency is $F_s/5$. It turns out that 22 data samples and 58 coefficients have to be stored in this FIR filter implementation.

Figure 4:
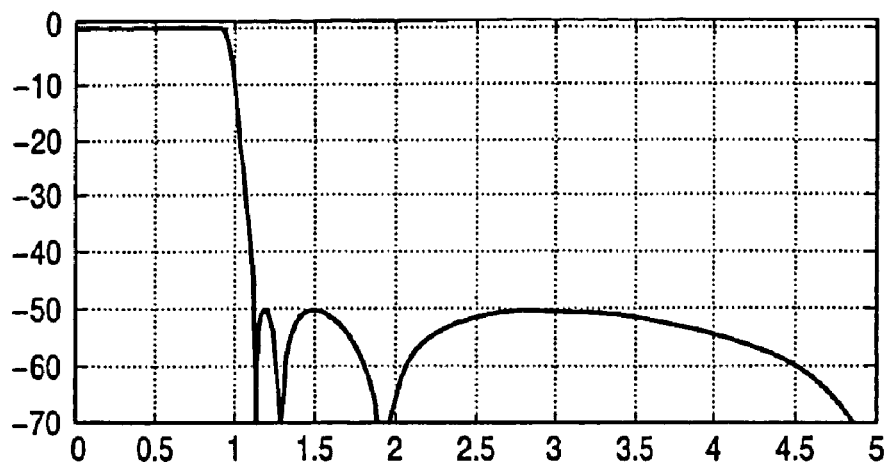
FIG. 4 shows the amplitude characteristic of the one stage IIR filter implementing FIG. 1.
Figure 5A:
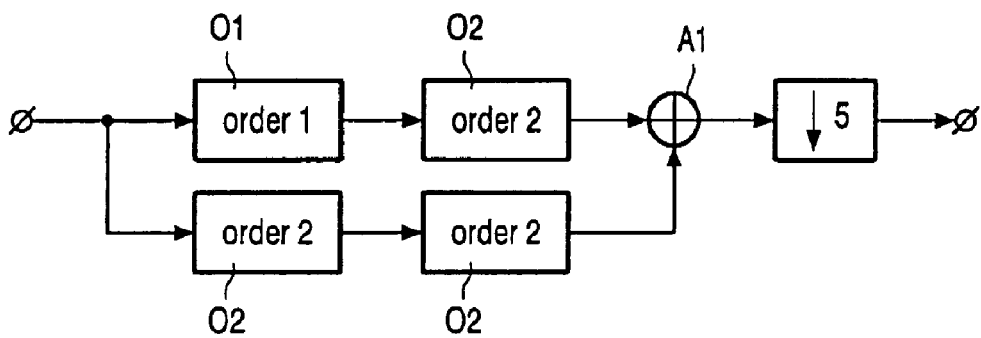
FIG. 5a shows the one stage IIR filter implementation, comprising the first and second order all pass sections O1 and O2 shown in FIGS. 5b and 5c respectively.
Figure 5B:
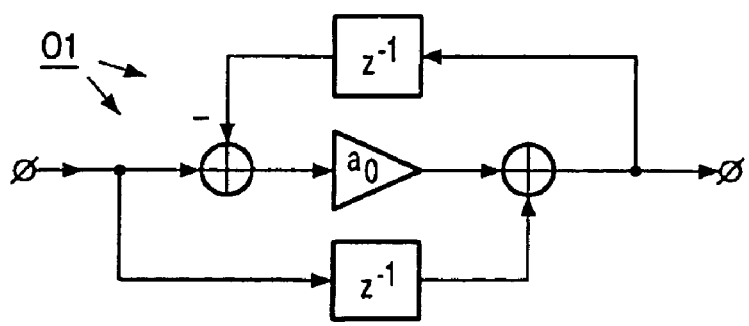
Figure 5C:
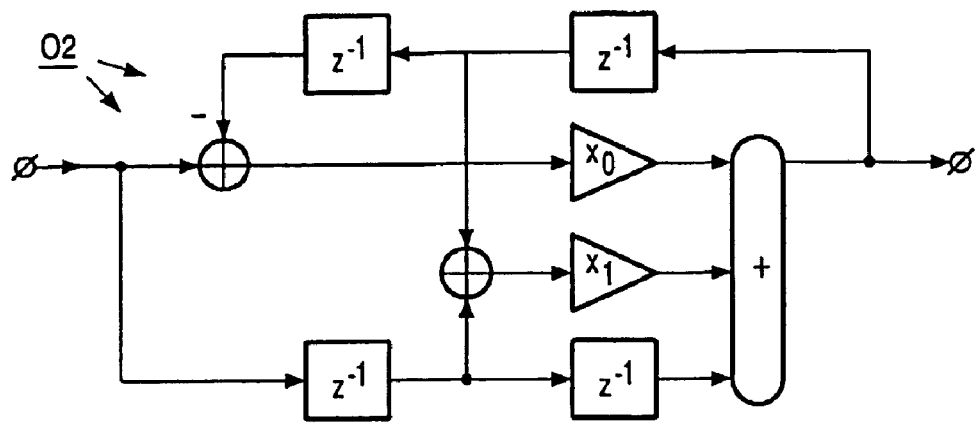

If one stage down-sampling according to FIG. 1 would have been implemented by means of IIR filters the amplitude response of the filter function H(z) looks like shown in FIG. 4. Such a filter function, which has the seventh order could be implemented by two parallel branches one of third order and one of fourth order. The first branch comprises a first order all pass section O1 implemented in FIG. 5b and a second order all pass section O2 implemented in FIG. 5c. The second branch comprises two all pass sections O2 in series. The outputs of the two parallel branches are added in adder A1. These efficient structures are again devised by means of polyphase decomposition, and the branches are sampled with sampling frequency $F_s$.

Table I hereunder gives the complexity in terms of the necessary number of multiplications and additions, and the data sample and coefficient storage capacity required in the one stage filter of FIG. 1 in FIR and IIR implementations respectively.

TABLE I

| Number of | FIR implementation | IIR implementation |
|---|---|---|
| Multiplications | 20.8 * $F_s$ | 7 * $F_s$ |
| Additions | 22.8 * $F_s$ | 15 * $F_s$ |
| Data samples | 22 | 10 |
| Coefficients | 58 | 7 |

Figure 6:
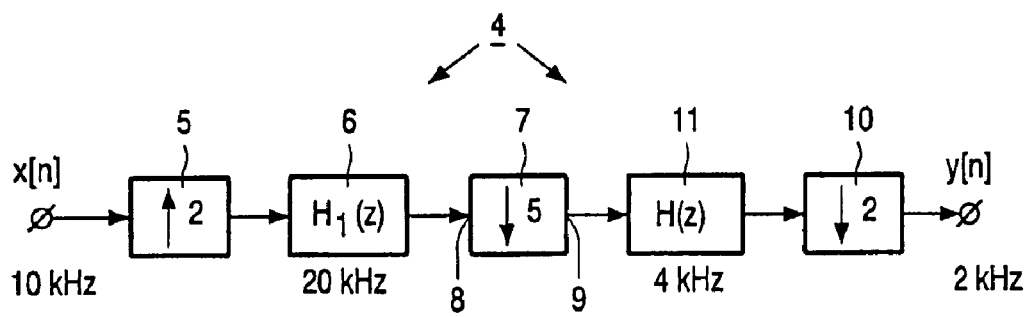
FIG. 6 shows a possible embodiment of a two stage time discrete filter according to the present invention, which is equivalent to the filter of FIG. 1.

FIG. 6 shows a multistage, in particular two-stage time discrete filter 4, whose properties are equivalent to the filter 1 of FIG. 1. The time discrete filter 4 comprises a first up-sampler 5 having an up-sampling factor $n_u$, which is equal to 2 in this case. Such factor 2 up-samplers can be implemented very efficiently, which is generally not the case for up-samplers having up-sampling factors differing from 2. The discrete filter 4 comprises a first filter section 6 having a transfer function H1(z), followed by a sampling rate converter in the form of a first down-sampler 7 provided with an input 8 and an output 9. The down-sampler 7 has a down-sampling factor m. Generally, but not necessarily m is larger than 2. In general sampler 7 may either be an interpolator, or a decimator. In particular the down- or possible up-sampling factor m will be a prime number or for example a product of prime numbers. Here down-sampler input 8 is coupled to the factor 2 up-sampler 5 and sampler output 9 is coupled to a second down-sampler 10 through a second filter section 11, which has a transfer function H2(z). In general the second down-sampler 10 has a down-sampling factor $n_d$, which factor in this case equals 2 in order for the filter section 11 to be implemented very efficiently. If only a down-sampling with a factor m is required $n_u$ will be equal to $n_d$. In general $n_u$ and $n_d$ will be equal or larger than 2. Despite the optically more comprehensive configuration of the filter 4 it will turn out that the filter configuration of FIG. 4 provides substantial advantages over the filter of FIG. 1 in terms of computational complexity and required storage capacity.

Filter sections 6 and 11 having transfer functions H1(z) and H2(z) respectively can each be implemented digitally by a Finite Impulse Response (FIR) filter and/or an Infinite Impulse Response (IIR) filter. Examples thereof will be given hereinafter.

Figure 3:
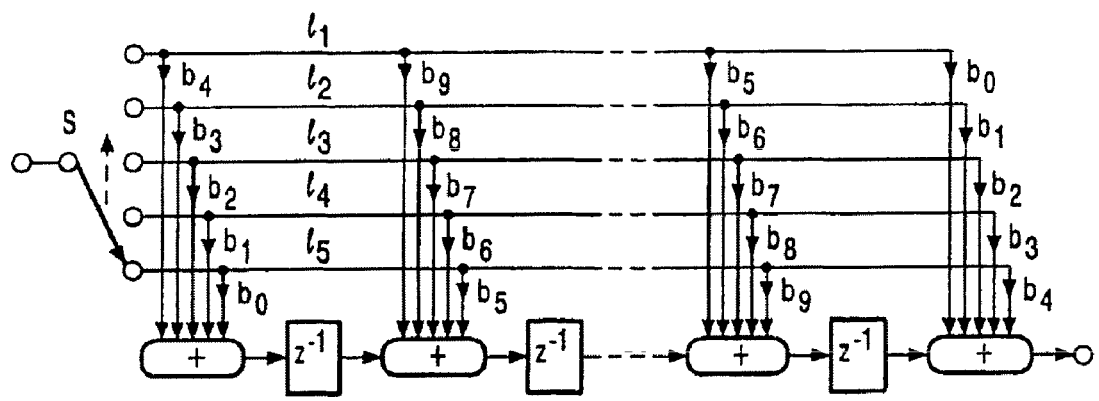
FIG. 3 shows the one stage FIR filter implementation.
Figure 7:
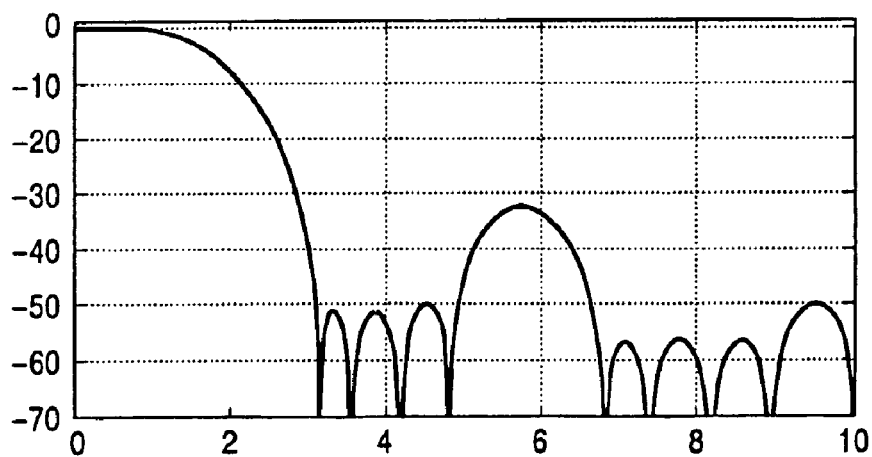
FIG. 7 shows the amplitude response of a FIR filter implementation of the first stage filter H1(z) of FIG. 6.

FIG. 7 shows the amplitude response of H1(z) in the first stage of FIG. 6, which increases the sampling frequency by a factor 2/5, while use is made of a linear phase FIR filter having a length of 20. The FIR filter implementation of H1(z) is similar to the FIR implementation shown in FIG. 3, provided the dashed lines are all replaced by drawn lines. The switch S rotates counter clockwise and in between every input sample x(n) the switch S now makes two steps. This means that there are:

(a) three input samples at the upper, middle and lower horizontal parallel lines $1_1$, $1_3$, $1_5$ respectively coupled to the switch $S_1$ and zeros at the other two lines $1_2$ and $1_4$ respectively, or (b) zeros at the upper, middle and lower lines $1_1$, $1_3$, $1_5$ respectively and two input samples at the other two lines $1_2$ and $1_4$ respectively.

In case (a) this amounts to 4+2+4=10 multiplications and 2+3+3=11 additions and in case (b) this amounts to 1+3*2=7 additions. So 18 multiplications and 18 additions are needed for 5 input samples; equivalent with a rate $F_s/5$. Also 3 data samples and 10 coefficients need to be stored. See table II hereunder.

Figure 8:
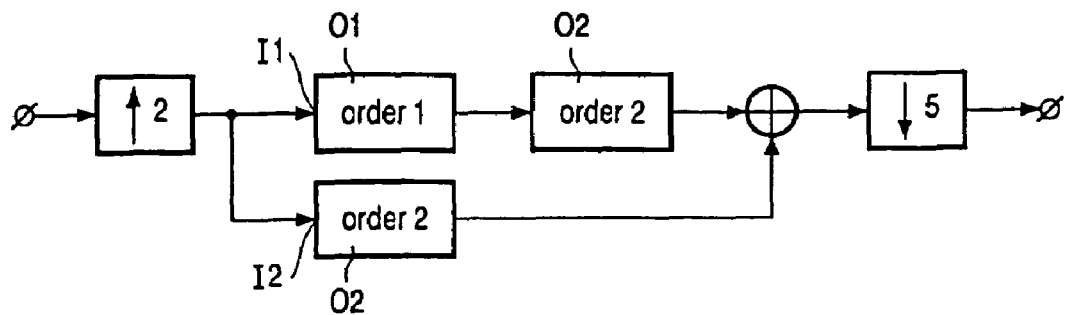
FIG. 8 shows the IIR filter implementation of the first stage filter H1(z) of FIG. 6.

If use is made of a IIR filter for configuring the transfer function H1(z) of FIG. 6 the fifth order recursive configuration given by FIG. 8 can be used. Herein the first and second order allpass sections O1 and O2 are given by FIGS. 5b and 5c respectively. Herein 1+2+2=5 multiplications at a rate $2F_s$ are needed, such that odd numbered samples fed to input I1 of the first order section O1 and input I2 of the second order section O2 are equal to zero. Therefore one addition is needed in the first order filter of FIG. 8. For the second order filter of FIG. 8 two additions are needed for a zero input sample and three additions are needed for a non zero input sample. This leads to $10F_s$ multiplications and $(1+2.5+4+1)*2F_s=17 F_s$ additions per second, as also shown in table II.

TABLE II

| Number of | FIR case | IIR case |
|---|---|---|
| Multiplications | 3.6$F_s$ | 10$F_s$ |
| Additions | 3.6$F_s$ | 17$F_s$ |
| Data samples | 3 | 8 |
| Coefficients | 10 | 5 |

It follows from table II that the FIR case is more efficient than the IIR case. This is due to the fact that the polyphase decomposition can be used for the FIR case, but not for the IIR case. The minor disadvantage for the FIR case is that twice the number of coefficients have to be stored. Therefore hereafter only the FIR case will be used for implementing H1(z).

Figure 9:
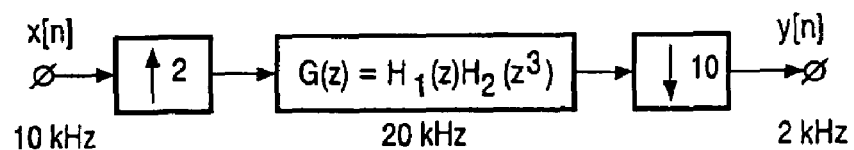
FIG. 9 shows a circuit which is equivalent to the filter of FIG. 6.
Figure 10:
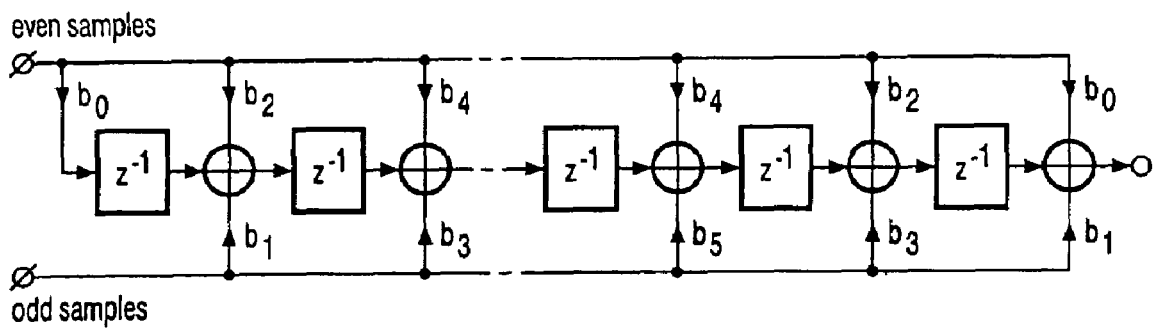
FIG. 10 shows the FIR filter implementation of the second stage filter H2(z) of FIG. 6.

Next the filter design of the transfer function H2(z) of FIG. 6 will be considered, using FIR and/or IIR filters. Without going into to much detail an equivalent circuit as shown in FIG. 9 can be used to devise the filter configuration of the transfer function H2(z). In this circuit the sampling frequency is first increased by a factor 2; then interpolated by the equivalent filter having system function G(z)=H1(z) H2($z^5$) and finally the filtered circuit output is down-sampled by a factor 10. At wish a further equivalent circuit comprising a system function G'(z) which is the two phase decomposition of G(z) followed by a factor 5 down sampler can be considered as a further equivalent to the circuit of FIG. 9 for calculation purposes. Again posing pass band and stop band requirements results in a linear phase FIR filter for H2(z) having a length 47 and for performing down sampling by two. This FIR filter for the second stage H2(z) is shown in FIG. 10. An input switch (not shown) distributes even numbered input samples to upper multipliers schematically referred to as $b_0, b_2, b_4, \ldots, b_{20}, b_{22}, b_{20}, \ldots, b_4, b_2, b_0$ and similarly odd samples to lower multipliers $b_1, b_3, \ldots, b_{21}, b_{23}, b_{21}, \ldots, b_3, b_1$. In order to calculate a new output sample, one even and one odd sample each have to be multiplied by 2*12=24 coefficients, whereby 23*2=46 additions are needed. The output sampling frequency is $F_s/5$. This results in $4.8F_s$ multiplications and $9.2F_s$ additions per second. Table III hereunder compares the former one stage FIR filter with the two stage configuration wherein H1(z) and H2(z) are both implemented with FIR filters.

TABLE III

| Number of | One stage FIR | FIR H1(z) | FIR H2(z) | Two stage FIR total |
|---|---|---|---|---|
| Multiplications | $20.8F_s$ | $3.6F_s$ | $4.8F_s$ | $8.4F_s$ |
| Additions | $22.8F_s$ | $3.6F_s$ | $9.2F_s$ | $12.8F_s$ |
| Data samples | 22 | 3 | 23 | 26 |
| Coefficients | 58 | 10 | 24 | 34 |

From table III it can be concluded that a two stage FIR filter is more efficient than a one stage FIR filter. Only the number of data samples to be stored is higher in the two stage FIR filter.

Figure 11:
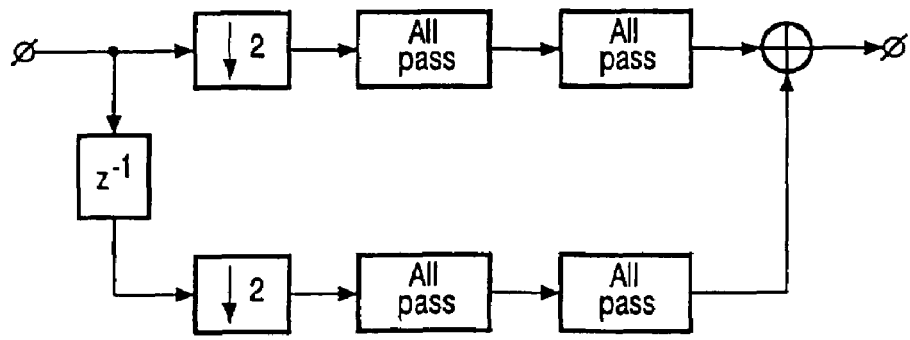
FIG. 11 shows the IIR filter implementation of the second stage filter H2(z) of FIG. 6.

A very efficient filter structure is the two stage configuration having a FIR structure for the H1(z) filter explained above and an IIR structure for the H2(z) filter of FIG. 6. The recursive IIR structure for the H2(z) filter may look like shown in FIG. 11. The four allpass sections as shown in FIG. 11 may be similar to the order 1 section O1, shown in FIG. 5a and further detailed by FIG. 5b. The all pass sections in FIG. 11 run on $F_s/5$ and each all pass section uses one multiplication and two additions per output sample. This amounts to $(4*1)F_s/5$ multiplications and $(4*2+1)F_s/5$ additions per output sample (one addition is needed to add the outputs to the two parallel branches. Two delay elements are used in each All pass section. Table IV lists the complexity for comparing the one stage IIR filter of FIG. 1 with the two stage filter of FIG. 6 having a FIR for filter H1(z) and a IIR for filter H2(z).

TABLE IV

| Number of | One stage IIR | FIR H1(z) | IIR H2(z) | Two stage FIR & IIR total |
|---|---|---|---|---|
| Multiplications | $7F_s$ | $3.6F_s$ | $0.8F_s$ | $4.4F_s$ |
| Additions | $15F_s$ | $3.6F_s$ | $1.8F_s$ | $5.4F_s$ |
| Data samples | 10 | 3 | 7 | 10 |
| Coefficients | 7 | 10 | 4 | 14 |

It may be again be concluded that the two stage FIR & IIR solution is more efficient than the one stage IIR solution in terms of number of required multiplications and additions. Only somewhat more filter coefficients have to be stored.

The above explained filter concepts may of course be generalised to other generally prime down sampling or up sampling factors. The corresponding structures for up sampling by a prime number or product thereof larger than 2 can be found by using the well known transposition theorem. See "On the Transposition of Linear Time-Varying Discrete-Time Networks and its Applications to Multirate Digital Systems" by T. A. C. M. Claasen and W. F. G. Mecklenbräuker, Philips Journal of Research, 1978, pp 78-102.

The filter concepts explained above may be applied in any digital transmission or communication system or device. Examples thereof are digital data processing devices or filters, telephone sets, audio or video processing devices, television, image processing devices or the like. The filter 4 may be implemented in a way known per se by for example a switched capacitor filter or a switched current filter.

Whilst the above has been described with reference to essentially preferred embodiments and best possible modes it will be understood that these embodiments are by no means to be construed as limiting examples of the circuits and methods concerned, because various modifications, features and combination of features falling within the scope of the appended claims are now within reach of the skilled person.

The invention claimed is:

1. A time discrete filter comprising:
    a sampling rate converter provided with an input and an output, the sampling rate converter being a down-sampling rate converter having a sampling rate conversion factor m;
    a first filter directly connected to the input of the sampling rate converter;
    a second filter directly connected to the output of the sampling rate converter;
    a down-sampler having a down-sampling factor $n_d$, the down-sampler being directly connected to the second filter; and
    an up-sampler having an up-sampling factor $n_u$, the up-sampler being directly connected to the first filter.

2. The time discrete filter according to claim 1, wherein the sampling rate conversion factor m, the up-sampling factor $n_u$ and the down-sampling factor $n_d$ are integers.

3. The time discrete filter according to claim 2 wherein the sampling rate conversion factor m is an integer larger than 2.

4. The time discrete filter according to claim 3, wherein the sampling rate conversion factor m is a prime number or a product of prime numbers.

5. The time discrete filter according to claim 1, wherein each of the up-sampling factor $n_u$, and the down-sampling factor $n_d$ is larger or equal to 2.

6. The time discrete filter according to claim 5, wherein the up-sampling factor $n_u$ is equal to the down-sampling factor $n_d$.

7. The time discrete filter according to claim 1, wherein each of the first and second filters being a digital FIR filter or a digital IIR filter.

8. A communication device comprising:
    at least time one discrete filter, each time discrete filter comprising:
        an up-sampler having an up-sampling factor $n_u$;
        a first filter directly connected to the up-sampler;
        a sampling rate down converter having a sampling rate down conversion factor m, the sampling rate down converter being directly connected to the first filter;
        a second filter directly connected to the sampling rate down converter; and
        a down-sampler having a down-sampling factor $n_d$, the down-sampler being directly connected to the second filter.

9. The communication device according to claim 8, wherein the sampling rate down conversion factor m, the up-sampling factor $n_u$ and the down-sampling factor $n_d$ are integers.

10. The communication device according to claim 9, wherein the up-sampling factor $n_u$ is equal to the down-sampling factor $n_d$.

11. The communication device according to claim 9, wherein the sampling rate down conversion factor m is an integer larger than 2.

12. The communication device according to claim 11, wherein the sampling rate down conversion factor m is a prime number or a product of prime numbers.

13. The communication device according to claim 9, wherein each of the up-sampling factor $n_u$ and the down-sampling factor $n_d$ is larger or equal to 2.

14. The communication device according to claim 8, wherein the sampling rate converter is configured to perform decimation or interpolation.

15. A method comprising:
up-sampling an input signal with an up-sampling factor of $n_u$ to produce an up-sampled signal;
filtering the up-sampled signal using a first transfer function to produce a first filtered signal;
converting a sampling rate of the first filtered signal down with a sampling rate down conversion factor m to produce a down-converted signal;
filtering the down-converted signal using a second transfer function to produce a second filtered signal; and
down-sampling the second filtered signal with a down-sampling factor of $n_d$ to produce an output signal used in a communication device for communication,
wherein the up-sampling, the filtering using the first transfer function, the converting, the filtering using the second transfer function and the down-sampling are performed in sequence respectively without any intermediate steps.

16. The method according to claim 15, wherein the sampling rate down conversion factor m, the up-sampling factor $n_u$ and the down-sampling factor $n_d$ are integers.

17. The method according to claim 16, wherein each of the up-sampling factor $n_u$ and the down-sampling factor $n_d$ is larger or equal to 2.

18. The method according to claim 17, wherein the up-sampling factor $n_u$ is equal to the down-sampling factor $n_d$.

19. The method according to claim 16, wherein the sampling rate down conversion factor m is an integer larger than 2.

20. The method according to claim 19, wherein the sampling rate down conversion factor m is a prime number or a product of prime numbers.

* * * * *